(12) United States Patent
Stump et al.

(10) Patent No.: US 12,032,362 B2
(45) Date of Patent: Jul. 9, 2024

(54) MULTI-USER COLLABORATION ACROSS DOMAINS FOR INDUSTRIAL AUTOMATION DESIGN

(71) Applicant: Rockwell Automation Technologies, Inc., Mayfield Heights, OH (US)

(72) Inventors: Andrew R. Stump, Mentor, OH (US); Srdjan Josipovic, Montreal (CA); Matthew R. Ericsson, Lyndhurst, OH (US); Michael D. Kalan, Highland Heights, OH (US); Anthony Carrara, Strongsville, OH (US); Christopher W. Como, Chagrin Falls, OH (US); Sharon M. Billi-Duran, Euclid, OH (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 1446 days.

(21) Appl. No.: 16/143,930

(22) Filed: Sep. 27, 2018

(65) Prior Publication Data

US 2020/0103864 A1    Apr. 2, 2020

(51) Int. Cl.
| | | |
|---|---|---|
| G05B 19/418 | (2006.01) | |
| G06F 11/32 | (2006.01) | |
| G06F 30/00 | (2020.01) | |
| G06Q 10/101 | (2023.01) | |
| H04L 65/1059 | (2022.01) | |

(52) U.S. Cl.
CPC ..... *G05B 19/4185* (2013.01); *G05B 19/4184* (2013.01); *G05B 19/4188* (2013.01); *G06F 30/00* (2020.01); *G06Q 10/101* (2013.01); *H04L 65/1059* (2013.01); *G06F 11/323* (2013.01)

(58) Field of Classification Search
CPC ........... G05B 19/4184; G05B 19/4188; G05B 19/4185; G06Q 10/101; H04L 65/1059; G06F 11/323; G06F 30/00
See application file for complete search history.

(56) References Cited

U.S. PATENT DOCUMENTS

| | | | |
|---|---|---|---|
| 1,102,402 A | * | 7/1914 | Gubelman ................ B62L 5/14 |
| | | | 192/113.36 |
| 6,874,148 B1 | | 3/2005 | Richardson et al. |
| (Continued) | | | |

FOREIGN PATENT DOCUMENTS

| | | |
|---|---|---|
| EP | 1284446 A1 | 2/2003 |
| EP | 2595510 A2 | 5/2013 |

OTHER PUBLICATIONS

Annonymous, GitHub Help Enterprises 2.13, Mar. 27, 2018, pp. 1-68 (Year: 2018).*

(Continued)

*Primary Examiner* — Nam T Tran

(57) ABSTRACT

The present disclosure is directed to systems, methods and devices for facilitating user communication for industrial automation system design. A first user's input for flagging an issue for review by a second user may be received in relation to a software object integrated in an industrial automation routine. A flag may be associated with the software object. A request to access the flagged issue may be received from the second user, and a location in the industrial automation routine corresponding to the flagged issue and the software object may be caused to be displayed on a computing device associated with the second user.

20 Claims, 7 Drawing Sheets

(56) References Cited

U.S. PATENT DOCUMENTS

| | | | |
|---|---|---|---|
| 6,931,288 | B1 | 8/2005 | Lee et al. |
| 7,324,856 | B1 | 1/2008 | Bromley |
| 7,809,683 | B2 | 10/2010 | Hood et al. |
| 8,041,435 | B2 | 10/2011 | Plache et al. |
| 8,887,134 | B2 * | 11/2014 | Weatherhead .......... G06F 30/00 |
| | | | 717/121 |
| 9,128,479 | B2 | 9/2015 | Reichard et al. |
| 9,430,359 | B1 * | 8/2016 | Troutman ............ G06F 11/0793 |
| 11,012,402 | B1 * | 5/2021 | McNulty, Jr. ........... H04L 51/52 |
| 2004/0019640 | A1 * | 1/2004 | Bartram ................ H04L 67/104 |
| | | | 709/205 |
| 2004/0075689 | A1 | 4/2004 | Schleiss et al. |
| 2005/0027376 | A1 | 2/2005 | Lucas et al. |
| 2005/0027377 | A1 | 2/2005 | Lucas et al. |
| 2005/0050210 | A1 * | 3/2005 | Kennedy .................... H04L 9/40 |
| | | | 709/229 |
| 2005/0222698 | A1 | 10/2005 | Eryurek et al. |
| 2006/0195817 | A1 | 8/2006 | Moon |
| 2006/0206867 | A1 * | 9/2006 | Parsons ............... G06F 11/3664 |
| | | | 717/124 |
| 2006/0259500 | A1 | 11/2006 | Hood et al. |
| 2006/0277027 | A1 | 12/2006 | Mann et al. |
| 2006/0277498 | A1 | 12/2006 | Mann et al. |
| 2007/0132779 | A1 | 6/2007 | Gilbert et al. |
| 2008/0127092 | A1 | 5/2008 | Tomar |
| 2010/0083232 | A1 | 4/2010 | Chouinard |
| 2012/0029661 | A1 | 2/2012 | Jones et al. |
| 2012/0317537 | A1 * | 12/2012 | Komar ................... G06Q 10/00 |
| | | | 717/101 |
| 2013/0123848 | A1 | 5/2013 | Duggal et al. |
| 2014/0129550 | A1 | 5/2014 | Weatherhead et al. |
| 2014/0129822 | A1 | 5/2014 | Weatherhead et al. |
| 2014/0130012 | A1 | 5/2014 | Weatherhead et al. |
| 2015/0363543 | A1 | 12/2015 | Mansouri et al. |
| 2016/0109875 | A1 | 4/2016 | Majewski et al. |
| 2017/0053289 | A1 * | 2/2017 | Wang ................. G05B 23/0278 |
| 2017/0185594 | A1 | 6/2017 | Schultz et al. |
| 2018/0113430 | A1 | 4/2018 | Naidoo et al. |
| 2019/0056719 | A1 | 2/2019 | Ong et al. |

OTHER PUBLICATIONS

Notice of Allowance sent in U.S. Appl. No. 16/144,073, dated Apr. 1, 2021, 49 pages.

United States Patent and Trademark Office, Notice of Allowance and Fee(s) Due for U.S. Appl. No. 16/144,105, dated May 18, 2021.

Borland: "Borland C++ User's Guide", Borland C++ User's Guide, Oct. 31, 1993, pp. 1-462, XP055627917, USA, http://www.bitsavers.org/pdf/borland/borland_C++_Version_4.0_Users_Guide_Oct93.pdf.

European Patent Office, Communication pursuant to Article 94(3) EPC for application No. 19 198 922.7-1222, dated Jul. 7, 2021.

European Search Report, Ref. EP124781-AN for European Appl. No. 19199778.2-1224 dated Feb. 20, 2020 Munich, DE, dated Mar. 27, 2020, 10 pages.

Final Office Action for Appl. No. 16/144, 105, dated Jun. 15, 2020, 84 pages.

Anonymous, "GitHub Help Enterprise 2.13", Mar. 27, 2018, pp. 1-68, retrieved on Feb. 1, 2023 from internet URL: https://docs.github.com/en/enterprise/2.13/user.

Communication Pursuant to Article 94(3) EPC from the European Patent Office for EP application No. 19 198 922.7 dated Feb. 8, 2023, 9 pages.

Non-Final Office Action for U.S. Appl. No. 16/144,171, dated Jun. 8, 2020, 43 pages.

European Search Report, dated Jun. 5, 2020, pp. 1-13, Munich, Germany.

Anonymous: "GitHub—Wikipedia", Sep. 22, 2018, pp. 1-12, XP055908621, retrieved from the Internet: URL: https://en.wikipedia.org/w/index.php?title=GitHub&oldid=860773824 [retrieved on Apr. 4, 2022].

Anonymous: "Getting Stated with GitHub: Par 2—Best practices for notifications—GitHub Original Series / Support Protips—GitHub Community", Jan. 25, 2018, pp. 1-3, XP055908520, retrieved from Internet: URL:https://github.community/t/getting-started-with-github-part-2-best-practices-for-notifications/10193 [retrieved on Apr. 4, 2022].

Galantino, Lexi: "Intoroducing embedded code snippets", Aug. 15, 2017, pp. 1-4, XP055908645, Retrieved from the Internet: URL:https://github.blog/2017-08-15-introducing-embedded-code-snippets [retrieved on Apr. 4, 2022].

European Search Report: "EP124776_EESR", dated Feb. 20, 2020, pp. 1-14, Munich, Germany.

* cited by examiner

MULTI-USER COLLABORATION ACROSS DOMAINS FOR INDUSTRIAL AUTOMATION DESIGN

BACKGROUND

Multiple industrial automation software engineers often work in parallel on new automation routines that involve the same industrial automation hardware. Because multiple automation routines may involve overlapping hardware components and same or similar software logic controlling those components, industrial automation software engineers may work on same software automation objects for same or different routines at the same time, and/or same routines that include same or different software automation objects.

It is with respect to this general technical environment that aspects of the present technology disclosed herein have been contemplated. Furthermore, although a general environment has been discussed, it should be understood that the examples described herein should not be limited to the general environment identified in the background.

SUMMARY

This summary is provided to introduce a selection of concepts in a simplified form that are further described below in the Detailed Description section. This summary is not intended to identify key features or essential feature of the claimed subject matter, nor is it intended to be used as an aid in determining the scope of the claimed subject matter.

Non-limiting examples of the present disclosure describe systems, methods, and devices for facilitating user communication for industrial automation system design. In some examples, mechanisms are provided for allowing users working on automated routines to collaborate with other users that are working on same routines and/or same software automation objects via electronic messages and real-time, or near real-time communications. For example, a first user's input for flagging an issue for review by a second user may be received. The flag may be applied/received in relation to a software object integrated in the industrial automation routine. A flag corresponding to the user's input may be associated with the software object and a request to access the flagged issue may be received from the second user. In some examples, the first user's input for flagging the issue may comprise a request to leave a comment for review by the second user and associating the flag with the software object may comprise associating the first user's comment with the software object. A location in the industrial automation routine corresponding to the flagged issue and the software object may be caused to be displayed on a computing device associated with the second user, and the second user may collaborate or otherwise communicate with the first user via the flag.

DETAILED DESCRIPTION

Figure 1:
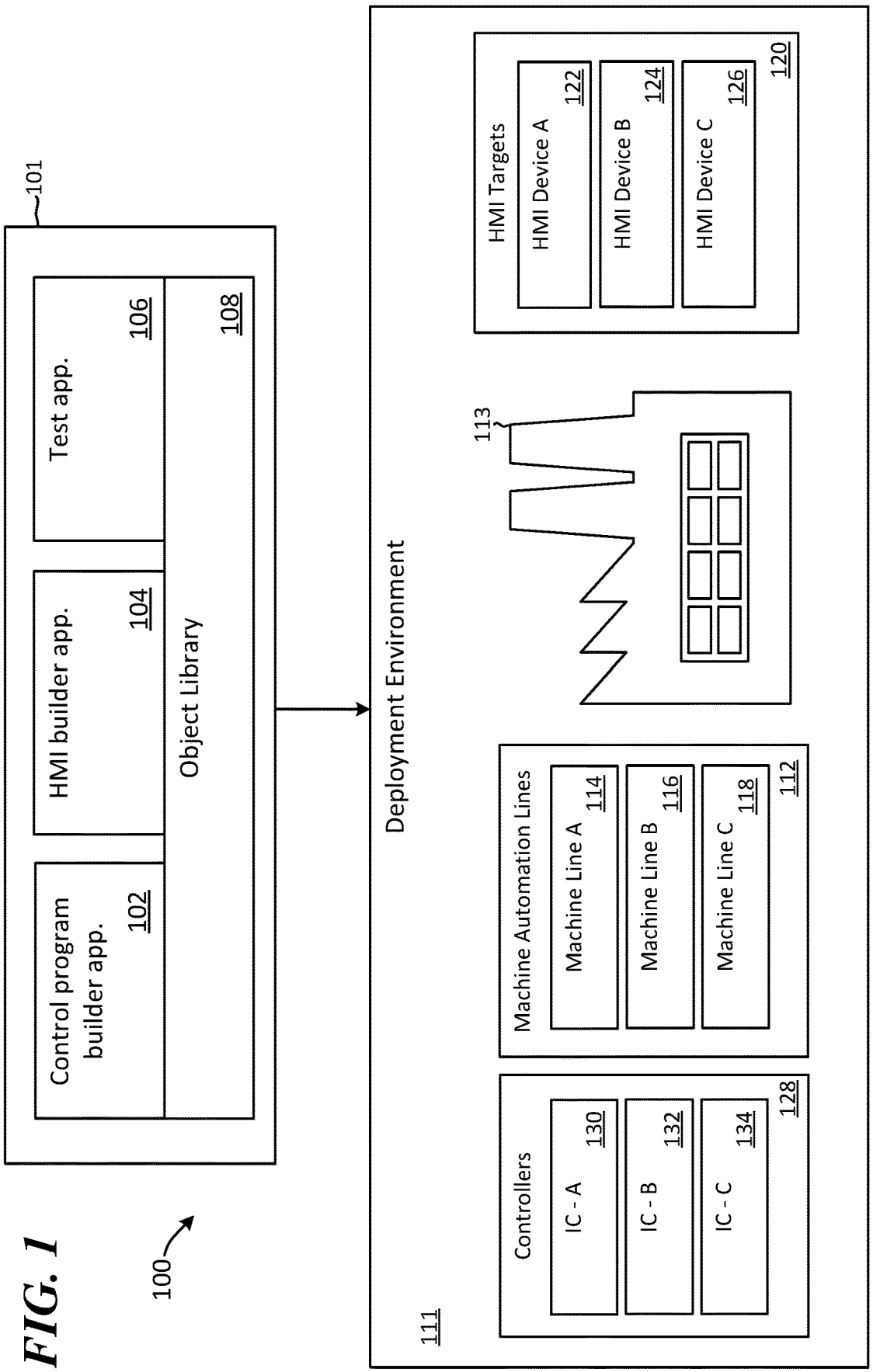
FIG. 1 is a schematic diagram of an exemplary distributed computing environment for facilitating user communication for industrial automation system design.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Aspects of the current disclosure provide systems, methods, and devices for facilitating user communication for industrial automation system design. Mechanisms are provided for allowing multiple users that are working on automation routines and/or controller logic that incorporate same software automation objects to communicate and collaborate with one another via comment sharing, messaging constructs, and flagging of issues. For example, a first user working on a first automation routine for an industrial automation process may add a comment related to a software automation object in that routine. The comment may include any content the first user desires to add in the comment, including questions and instructions for other users. The first user may designate specific users to receive the comment, users with specific credentials, and/or users that are working in a routine that also includes the software automation object the first user left a comment in relation to. In some examples, when a user leaves a comment and/or flags an issue associated with a software automation object for other users, those other users may receive notifications, alerts, and/or electronic messages notifying them to the comment and/or flagged issue. For example, users that are working on or that are otherwise associated with automated routines that include a software automation object that was associated with a comment and/or flag may receive electronic messages with a link that provides navigation directly to the comment and/or flag. Additional aspects described herein provide for real-time messaging communications amongst users in relation to shared software automation objects and automation routines.

Technical advantages are achieved via the mechanisms described herein. For example, processing costs (i.e., CPU cycles) previously associated with diagnosing and fixing bugs in industrial automation routines that share common elements are reduced. In previous solutions, if multiple users were each working on different routines that included some overlap in controller logic and/or hardware that implemented those routines, there was no way for those users to provide direct comments related to common elements that would navigate other users to an issue in those users' code and/or routines. As such, when errors and/or issues arose even in relation to shared elements, each user and/or design team would typically solve those errors and/or issues individually, rather than collaborating with one another (i.e., multiple fixes to a same problem). Utilizing the mechanisms described herein, users can collaborate on software automation object issues that impact multiple routines, solve those issues at the single object level, and deploy the single fixed object to multiple routines and/or multiple locations in those routines, thereby significantly reducing the time and processing costs associated with solving such issues.

FIG. 1 is a schematic diagram of an exemplary distributed computing environment 100 for facilitating user communication for industrial automation system design. Computing environment 100 includes automated industrial process software build sub-environment 101, machine automation lines sub-environment 112, HMI targets sub-environment 120, and controllers sub-environment 128. Any and all of the computing devices with regard to the various distributed computing environments described herein may communicate with one another via one or more wired or wireless networks. In some examples, controller sub-environment 128, machine automation lines sub-environment 112, and/or HMI targets sub-environment 120, may be deployed together in an industrial automation process factory setting, such as in factory 113 in deployment environment 111.

Automated industrial process software build sub-environment 101 includes control program builder application 102, HMI builder application 104, and test application 106, although other industrial automation applications are contemplated. Automated industrial process software build sub-environment 101 also includes object library 108, which comprises a plurality of automated software objects that one or more of the applications in industrial process software build sub-environment 101 may share and/or access. In some examples, object library 108 may be stored locally on one or more computing devices associated with any of control program builder application 102, HMI builder application 104 and/or test application 106. In other examples, object library 108 may be located remotely (e.g., in cloud storage), and one or more computing devices executing control program builder application 102, HMI builder application 104, and/or test application 106, may access object library 108 via a wired or wireless network.

Control program builder application 102 comprises an application for building industrial automation software modules (e.g., single automation control device files, multiple automation control device files) for execution by one or more industrial controllers (e.g., industrial controller—A 130, industrial controller—B 132, industrial controller—C 134) in the performance of routines of an automated industrial process. In some examples, the industrial automation software modules that may be built using control program builder application 102 may comprise ladder logic, function block diagram, sequential function chart, structured text, instruction list, C, and C++, among other software forms.

A ladder logic software module may comprise one or more ladder logic statements, referred to as rungs or instructions. The ladder logic statements define relationships between an output variable and one or more input variables. Input variables are variables that correspond to signals at input terminals and output variables are variables that correspond to signals at output terminals. In relay ladder logic, the input and output signals may be represented graphically as contact symbols and coil symbols arranged in a series of rungs spanning a pair of vertical power rails. A typical ladder logic statement may indicate that a specific output variable is "on" if and only if a first and second input is "on". The ladder logic software module, executed by one or more industrial controllers, manipulates single-bit input and output data representing the state of sensing and operating devices, such as devices machine automation lines sub-environment 112 (e.g., machine line A 114, machine line B 116, machine line C 118) in a factory setting. The ladder logic software module, executed by the one or more industrial controllers, also performs arithmetic operations, timing and counting functions and more complex processing operations. As noted above, however; a controller logic may be created in other software languages, and at its core, the logic functions by taking in inputs from field devices, performing calculations and operations on those inputs, and writing outputs for controlling the field devices based on the calculations.

HMI builder application 104 is an application for building industrial automation software modules (e.g., single HMI configuration files, multiple HMI configuration files) for execution on HMI devices in HMI targets sub-environment 120, which may include typical HMI devices such as dedicated HMI panels, as well as deployment of automation visualization interfaces on computing devices such as smart phones and tablets. An HMI typically receives, via one or more controllers, and processes the status data from devices performing various routines in an industrial automation process (e.g., devices in machine automation lines sub-environment 112, which are deployed in factory 113). An HMI processes, utilizing one or more industrial automation software modules built in HMI builder application sub-environment 104, the status data to generate various graphical displays, which may indicate the current and historical performance of the machines. For example, an HMI graphical display might indicate status metrics of a drive, the pressure of a pump, the speed of a motor, or the output of a robot, each of which may be performing operations that are part of a routine executed in machine automation lines sub-environment 112, controlled from one or more industrial controllers in controllers sub-environment 128.

Test application 106 may perform one or more operations associated with loading industrial automation software modules into virtualized industrial controllers and running one or more industrial automation routines encoded as instructions in the software modules on the virtualized industrial controllers. Test application 106 may utilize the properties of various objects from object library 108 employed in the execution of one or more routines to determine whether new industrial automation software controller modules created in control program builder application 102 perform as desired. Test application 106 may also utilize the properties of various objects from object library 108 employed in the execution of one or more routines to determine whether new industrial automation software HMI modules created in HMI builder application 104 perform as desired. If bugs or unintended issues arise in the testing of one or more routines, test application 106 may identify an object and or software module associated with the problem and flag it for review.

The industrial controllers in controllers sub-environment 128 (industrial controller—A 130, industrial controller—B 132, and industrial controller—C 134) are special purpose computers used for controlling factory devices performing one or more routines in machine automation lines sub-environment 112. Under the direction of one or more industrial automation software modules (e.g., industrial automation software modules built by control program builder application 102), a processor of an industrial controller examines a series of inputs reflecting the status of a controller process or device and changes outputs affecting control of the controlled process or device. The industrial controllers in controllers sub-environment 128 may be constructed in modular fashion to accommodate different application types requiring different numbers and types of input/output (I/O) circuits as is determined by the particular device or process being controlled.

Industrial automation software modules may be delivered to the industrial controllers in source format, token format, object code or executable code. These modules can bind to and use hardware, firmware and/or operating system resources of the industrial controllers. Loadable libraries may be provided to the industrial controllers during runtime to extend functionality and/or provide desired fixes. The stored industrial automation software modules run in real-time or near real-time to provide outputs to the control processes as electrical signals to outputs such as actuators and the like. The outputs are based on the logic of an industrial automation software module and inputs received from sensors of a controlled process being performed in machine automation lines sub-environment 112 in a factory such as in factory 113. One or more industrial controllers may be involved in the performance of routines in machine automation lines sub-environment 112, and the industrial controllers involved in those routines may communicate with the various devices performing those routines via local connections, such as by ethernet, or over a wireless network.

One or more of the industrial controllers in controllers sub-environment 128 may comprise programmable logic controllers (PLCs), which execute a series of operations that are performed sequentially and repeatedly. In general, the series of operations includes an input scan, a program/module scan and an output scan. During the input scan the PLC examines the on or off state of the external inputs and saves these states temporarily in memory. During the program/module scan the PLC scans the instruction of the program/module and uses the input status to determine if an output will be energized. The output results are then saved to memory. During the output scan the controller will energize or de-energize the outputs based on the output results stored in memory to control the external devices.

The computing devices in computing environment 100 utilize object-oriented programming techniques. Additionally, the various sub-environments in computing environment 100 may utilize shared object programming techniques whereby objects in object library 108, and the objects' properties, are shared amongst software modules (e.g., HMI software modules in HMI targets sub-environment 120, controller software modules in controllers sub-environment 128). Object oriented programming shifts the emphasis of software development away from function decomposition and towards the recognition of units of software called "objects" which encapsulate both data and functions. Object oriented programming objects are software entities comprising data structures and operations on data. Together, these elements enable objects to model virtually any real-world entity in terms of its characteristics, represented by its data elements, and its behaviors represented by its data manipulation functions. In this way, objects can model concrete things like physical components of automated industrial processes (e.g., pumps, belts, filters, tanks, computers), and they can model abstract concepts like numbers or geometrical concepts (e.g., flow rate values, tank volumes, connection types).

Each object in object library 108 may comprise a set of data (e.g., attributes) and a set of operations (e.g., methods), that can operate on the data. Each object in object library 108 may additionally or alternatively comprise a set of renderings that can display a set of data, self-describing documentation, one or more graphs that trace object data, and/or a set of configurations that provide alarms related to the data. Methods in an object are invoked by passing a message to the object. The message specifies a method name and an argument list. When the object receives the message, code associated with the named method is executed with the formal parameters of the method bound to the corresponding values in the argument list. Methods and message passing in object oriented programming are analogous to procedures and procedure calls in procedure-oriented software environments.

However, while procedures operate to modify and return passed parameters, methods operate to modify the internal state of the associated objects (by modifying the data contained therein). The combination of data and methods in objects is called encapsulation. Encapsulation provides for the state of an object to only be changed by well-defined methods associated with the object. When the behavior of an object is confined to such well-defined locations and interfaces, changes (e.g., code modifications) in the object will have minimal impact on the other objects and elements in the system.

Each object in object library 108 represents a class of some control element. A class includes a set of data attributes plus a set of allowable operations (e.g., methods) on the data attributes. Object oriented programming supports inheritance—a class (called a subclass) may be derived from another class (called a base class, parent class, etc.), where the subclass inherits the data attributes and methods of the base class. The subclass may specialize the base class by adding code which overrides the data and/or methods of the base class, or which adds new data attributes and methods. Thus, inheritance represents a mechanism by which abstractions are made increasingly concrete as subclasses are created for greater levels of specialization. One or more objects in object library 108 may comprise complex objects built from multiple instances of similar objects. Systems, methods and devices described herein may employ abstract object classes, which are designs of sets of objects that collaborate to carry out a set of responsibilities. Frameworks are essentially groups of interconnected objects and classes that provide a prefabricated structure for a working application. Additional description related to the objects and their implementation in the current invention is provided in relation to FIG. 2.

Figure 2:
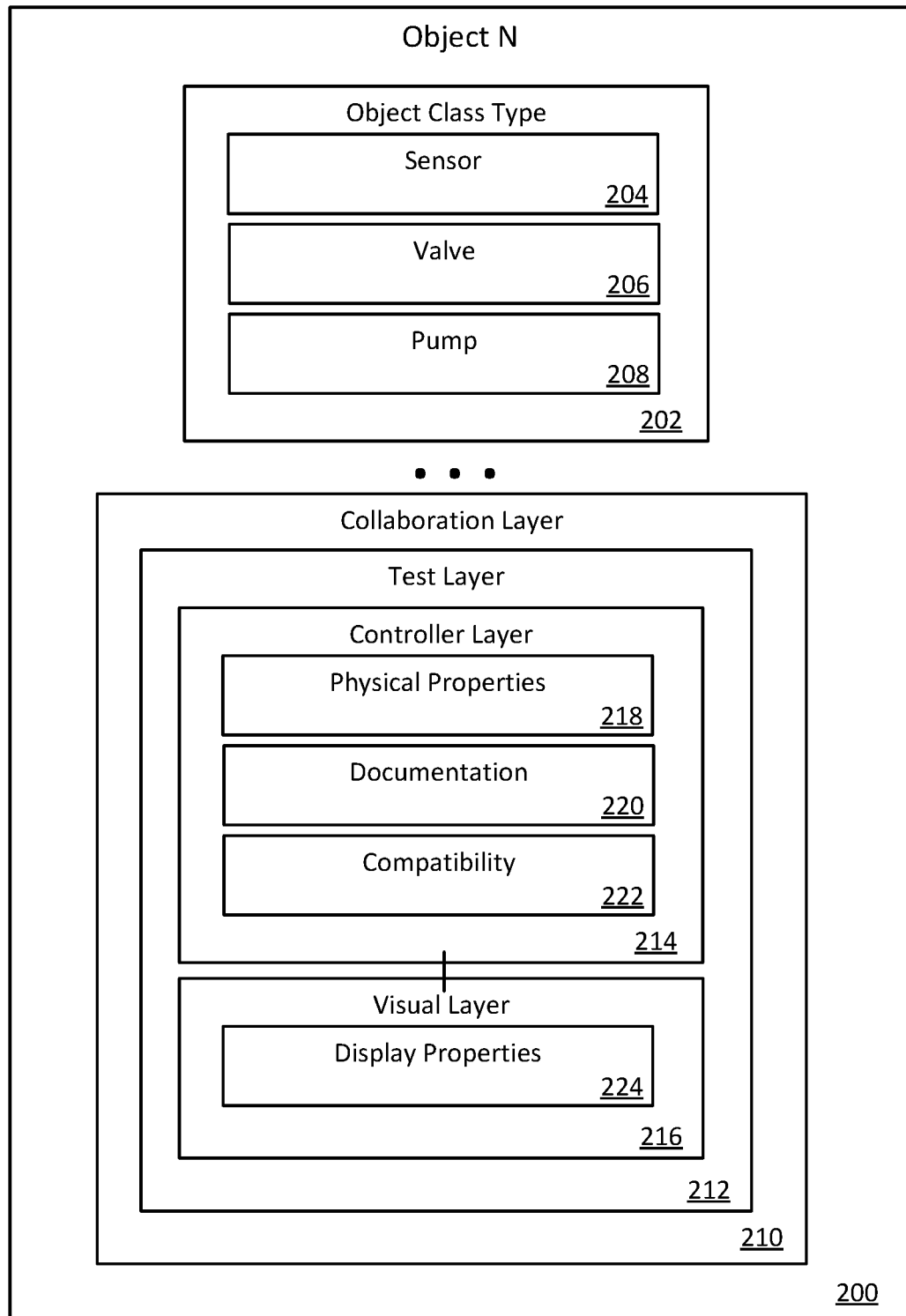
FIG. 2 is a simplified block diagram of an exemplary automation software object and its various components, which may be utilized in the control and visualization of industrial automation processes.

FIG. 2 is a simplified block diagram of an exemplary automation software object 200 and its various components, which may be utilized in the control and visualization of industrial automation processes and routines. Object 200 is an automation software object that may be included as part of a software object library, such as object library 108. In some examples, object 200 may be incorporated in controller software modules for execution by one or more industrial controllers for controlling operations associated with automated industrial processes and routines, and/or virtualized industrial controllers for virtually controlling operations associated with automated industrial processes and routines. In additional examples, object 200 may be incorporated in HMI software modules for execution by one or more HMIs for generating various graphical displays, which may indicate the current and historical performance of the machines associated with automated industrial processes and routines.

In additional examples, object 200 may be incorporated in both HMI software modules and controller software modules.

Object 200 comprises a class type 202. While various class types are possible for assignment to object 200, for exemplary purposes, object 200 is indicated as having one of a sensor class type 204, a valve class type 206, or a pump class type 208 assigned to it. The class types depicted in the object class type 202 element each correspond to a common hardware type in industrial automation processes, and they are provided for exemplary purposes; however, users may also create their own class types, which may correspond to combinations of product types and/or product skids (e.g., combinations of devices for performing various automation routines). Additionally, although broad class types are shown for ease of example, each class type may have sub-class types as well (e.g., specific types of sensors, valves, pumps, controllers, displays, etc.), for which more exact specifications may be associated with object 200.

Object 200 also includes collaboration layer 210, test layer 212, controller layer 214, and visual layer 216. Controller layer 214 comprises a plurality of properties and property types, including physical properties 218, documentation properties 220, and compatibility property type 222. In some examples, controller layer 214 may also comprise controller code and/or properties.

Documentation properties 220 may include information about the specific object type specified in object class type 202. For example, if object 200 is a specific brand and type of valve, documentation properties 220 may specify the name of the manufacturer of the valve, actions that may be performed by the valve, operating pressures that the valve can withstand, operating temperatures that the valve can withstand, flow rate, etc. If object 200 is a specific brand and type of temperature sensor, documentation properties 220 may specify the name of the manufacturer of the sensor, temperature range of the sensor, accuracy range of the sensor, scan frequency of the sensor, etc. If object 200 is a specific brand and type of pump, documentation properties 220 may specify the name of the manufacturer of the pump, maximum discharge flow for the pump, maximum discharge pressure for the pump, operating temperatures that the pump can withstand, horsepower for the pump, etc.

Compatibility properties 222 may also include information about the specific object type specified in object class type 202. For example, if object 200 is a specific brand and type of valve, compatibility properties 222 may specify types of service the valve is intended to handle (e.g., air, gas, liquid, vacuum), connection types, etc. If object 200 is a specific brand and type of temperature sensor, compatibility properties 222 may specify types of environments it is intended to handle (e.g., air, gas, liquid, vacuum), connection types, etc. If object 200 is a specific brand and type of pump, compatibility properties 222 may specify types of service the pump is intended to handle (e.g., types of fluid), connection types, etc.

Physical properties 218 include the physical specifications (e.g., size, geometry, mass, material etc.) of object 200.

Visual layer 216 includes display properties, which in association with one or more physical properties 218, documentation properties 220, and/or compatibility properties 222, may be utilized to accurately generate display components in real-time corresponding to components operating in an industrial automation routine. For example, display properties 224 may include various color properties for types of liquid and gas in an industrial automation routine, and when data from pumps, sensors and tanks from the routine are processed by the HMI and/or an industrial controller, those physical properties may be translated with the appropriate color types for the liquid and/or gas involved in the routine for graphically displaying the current state of the routine.

Controller layer 214 comprises a plurality of industrial controller-oriented operations/methods that may be performed by an industrial controller utilizing one or more properties of object 200, such as physical properties 218, documentation properties 220, compatibility properties 222, and/or display properties 224 (in association with visual layer 216). The operations performed by the industrial controller utilizing instructions associated with controller layer 214 direct hardware components of industrial automation processes to perform actions associated with ladder logic routines via various I/O communications as more fully described above.

Test layer 212 comprises a plurality of industrial controller-oriented operations/methods that may be performed by a virtual industrial controller utilizing one or more properties of object 200. The test layer may be associated with the performance of test script operations on object 200 that a typical industrial controller would be expected to perform, while flagging failed operations or operations that lead to unexpected results. Test layer 212 may also include a plurality of HMI-oriented operations/methods that may be performed by an HMI or virtualized HMI utilizing one or more properties of object 200, including display properties 224, physical properties 218, documentation properties 220, and/or compatibility properties 222.

Collaboration layer 210 comprises a plurality of operations/methods that may be performed on one or more properties of object 200. The collaboration operations/methods permit multi-user access to a control project, including centralized control, message coding from one user to another, collaborative development of industrial automation projects, such as collaborative development of application code for an industrial controller or design of an industrial automation process system. According to some examples, operations associated with collaboration layer 210 may provide mechanisms for users to leave notes for one another in association with objects and/or industrial automation projects that objects are included in. In additional examples, the operations associated with collaboration layer 210 may provide mechanisms for users to flag issues associated with development of industrial automation projects. In some examples, the operations associated with collaboration layer 210 may provide for cross-domain collaboration (e.g., a first user may leave a note related to an object while working with the object in HMI code and the note may be surfaced to a second user in relation to the same object in controller code that the second user is working on). In other examples, the operations associated with collaboration layer 210 may provide for same-domain collaboration (e.g., a first user may leave a note related to an object in a first area and/or routine of controller code and the note may be surfaced to a second user in relation to the same object in a second area and/or routine of controller code that the second user is working on).

Figure 3:
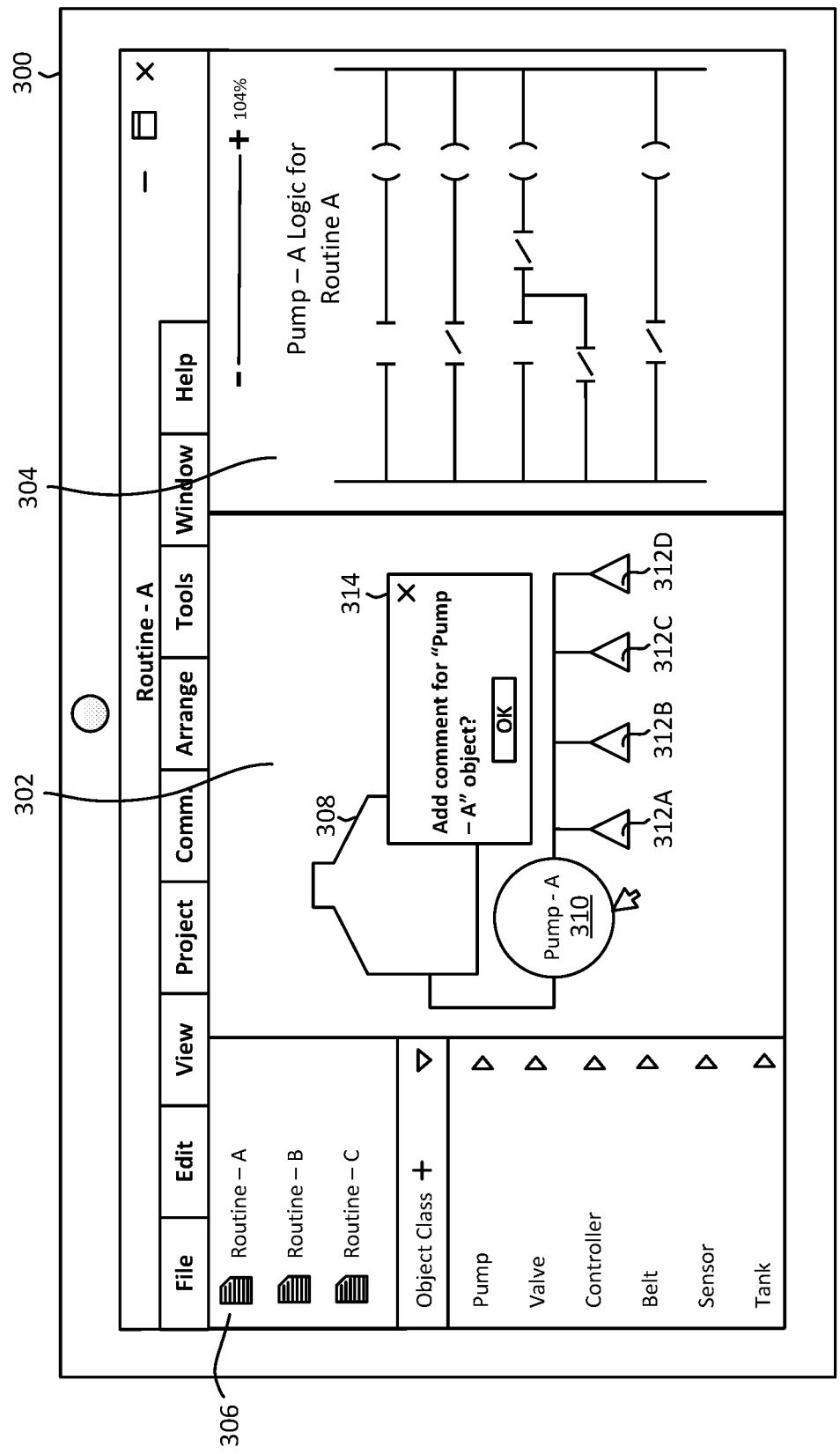
FIG. 3 is a simplified block diagram of a computing device executing an industrial automation application for building control logic for an industrial automation process, which incorporates cross-domain collaboration tools that a first user has utilized for communicating with a second user.

FIG. 3 is a simplified block diagram of a computing device 300 executing an industrial automation application for building control logic for an industrial automation process, which incorporates cross-domain collaboration tools that a first user has utilized for communicating with a second user. The user interface of the industrial automation application comprises automated routine system building environment 302, and controller logic environment 304. A plurality of automated routine files 306 are selectable in the upper left corner of the user industrial automation application user interface. In this example, a user has selected "Routine—A", which corresponds to the automated routine software displayed in automated routine system building environment 302 and the controller logic for a selected one of those objects (Pump—A) in controller logic environment 304 of the user interface for the industrial automation application.

In this example, automated routine system building environment 302 includes display elements for software automation objects that correspond to hardware components that are going to be utilized in an automated routine (routine—A). Those software automation objects are tank object 308, pump object 310 (pump—A), and valve objects 312A-312D. Controller logic environment 304 is a ladder logic programming environment that includes ladder logic for implementing routine A on the objects displayed in system building environment 302.

The user viewing automated routine system building environment 302 and controller logic environment 304 is working on those corresponding automated routine components in relation to routine A. However, one or more additional users may be working on one or more additional routines that involve overlapping hardware components, and therefore, overlapping software automation objects that represent those hardware components. As such, it is beneficial for users that are working on routines that involve overlapping components in parallel to collaborate with one another. By collaborating with one another, a first user working on a first routine can identify issues related to routines and/or objects that parallel users are working on and ensure that those other users take note of those issues as well. Similarly, if a first user working on a first routine has questions about a shared object, logic that controls that shared object, and/or a hardware component of that routine, the first user can communicate with other users working on parallel routines to resolve those questions in an efficient manner.

A user working on computing device 300 has selected pump object 310 in automated routine system building environment 302, and the control logic associated with that object for routine A is displayed in controller logic environment 304 of the industrial automation application. In this example, the user has identified an issue and/or question associated with pump object 310 that the user would like to collaborate on with another user that is working on the same pump object 310, but in a different routine, and or a different part of routine A. The user working in routine A may utilize input mechanisms, such as a touch input or a click input in relation to pump object 310 and/or the control logic for pump object 310 in controller logic environment 304, to initiate a communication mechanism for sending a communication to a second user related to pump object 310. In other examples, a collaboration menu including a plurality of selectable options for sending electronic communications of one or more types to other users associated with routine A and/or one or more objects associated with routine A may be incorporated in one or both of automated routine system building environment 302 or controller logic environment 304.

In some examples, a user may collaborate with other users in one or more industrial automation applications by leaving notes in association with objects, sets of objects, and/or routines. In other examples, a user may collaborate with other users in one or more industrial automation applications by leaving flags in association with objects, sets of objects, and/or routines that, when interacted with by other users in their respective files and/or routines, provide those interacting users with context for the respective flags (e.g., a comment may associated with the flag by the user that set it, code associated with a routine that the user that set the flag may be associated with the flag). In other examples, users may initiate real-time electronic communications with other users associated with same objects, sets of objects, and/or routines.

In this example, the user has initiated "add comment" functionality in relation to pump object 310 and its corresponding control logic. As such, pop-up window 314 is caused to be displayed on the user interface for the industrial automation application, which provides a mechanism for the user to send a message related to pump object 310 and its corresponding control logic to another user working with pump object 310 in another routine. Although in the illustrated example a user has identified a specific object that the user would like to collaborate with other users on (i.e., pump object 310), users may utilize the mechanisms described herein to collaborate and exchange electronic communications on projects as a whole, parts of projects (e.g., sets of objects, skid modules, etc.).

Figure 4:
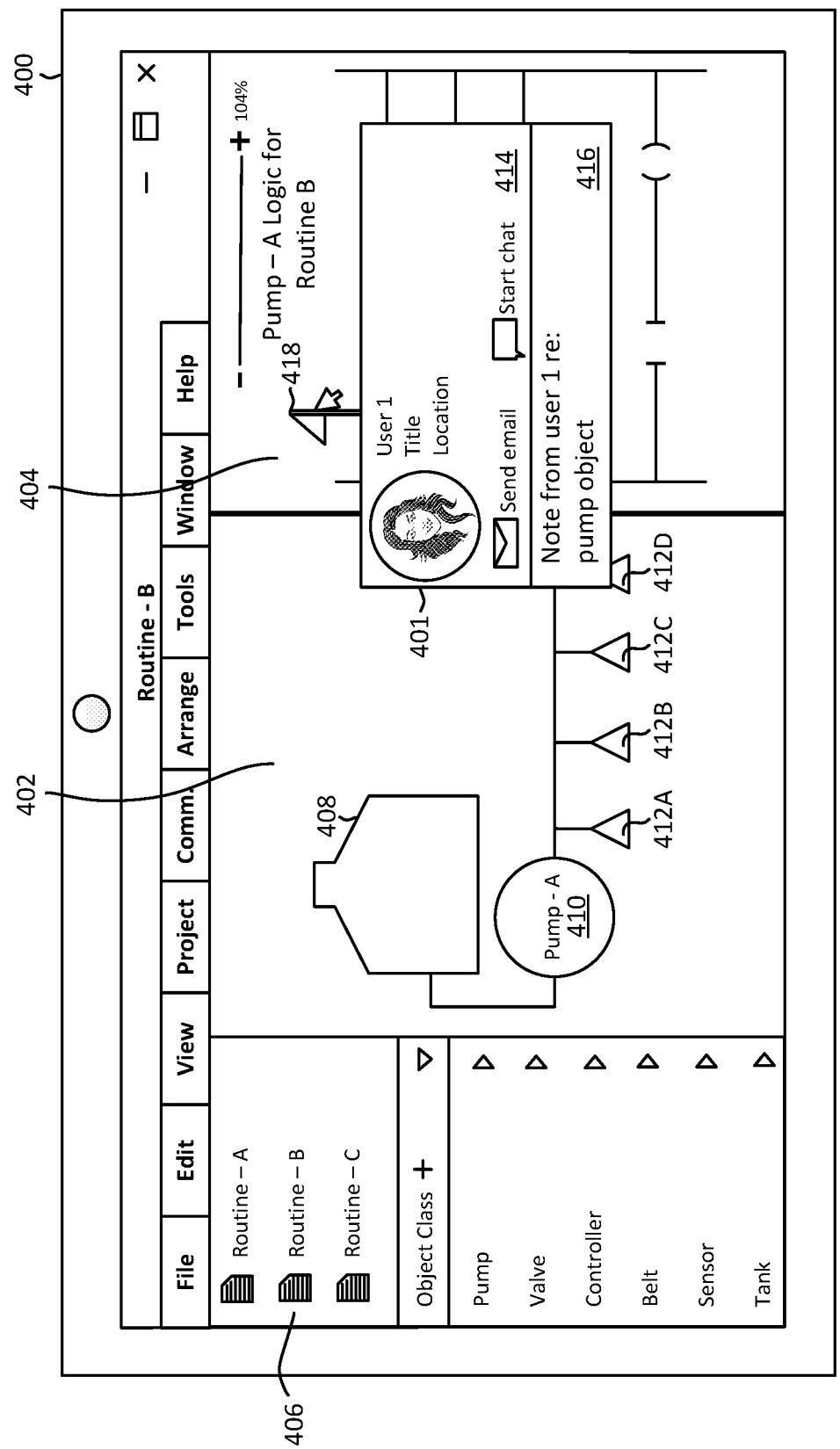
FIG. 4 is a simplified block diagram of a computing device executing an industrial automation application for building control logic for an industrial automation process, which incorporates cross-domain collaboration tools via which a second user has received a communication from a first user.

FIG. 4 is a simplified block diagram of a computing device 400 executing an industrial automation application for building control logic for an industrial automation process, which incorporates cross-domain collaboration tools via which a second user has received a communication from a first user. The second user has received comment 401 from the user discussed above in relation to FIG. 3.

In this example, the second user has selected routine B from the plurality of automated routine files 406. Software objects corresponding to routine B is displayed in system building environment 302, and logic for pump object 410 is displayed in controller logic environment 404. Pump object 410 is the same object as pump object 310 in FIG. 3. However, in this example, pump object 410 is employed in a different routine (routine B) than it was employed in in relation to pump object 310 (routine A). However, because the user working in routine B is viewing the controller logic for pump—A in controller logic environment 304, and/or because the user working in routine B is viewing pump object 410 in automated routine system building environment 402, comment 401 associated with pump object 310/410 that the user working in routine A left may be caused to be surfaced or otherwise made to be discoverable by the user working in routine B. In some examples, an indicator that there is a comment that another user left related to an object may be associated with controller logic for that object. In other examples, an indicator that there is a comment that another user left related to an object may be associated with a system/routine diagram that includes the object. In this example, a flag 418 (the indicator) is caused to be associated with the controller logic for the pump object 410 in controller logic environment 404.

A user may interact with display elements such as flag 418 to initiate presentation of the comment and/or message that a user working in the other routine left for her. For example, the user working in routine B may have clicked on, used voice activation, touch input, or other input mechanisms, to interact with flag 418. Once interacted with, the user's comment from routine A may be caused to be surfaced. Although in this example, a user has interacted with an indicator (flag 418) in order to have comment 401 surfaced on the display of computing device 400, in some examples, a comment may automatically be caused to be displayed when a user opens a routine that includes an object associated with a comment and/or when a user interacts with an object in a routine associated with a comment.

In this example, comment 401 is caused to be displayed in a pop-up window. However, other display mechanisms are possible. For example, a separate messaging interface may be opened for displaying comment 401, and/or a messaging application may be automatically opened and comment 401 may be presented therein. Comment 401 comprises a note 416 from the user that left comment 401 related to pump object 301/401. For example, the user that left the note may have left a question or instructions for other users working on the object in other routines. In some examples, a comment may include additional information, such as context and messaging information 414 in comment 401. Context and messaging information 414 includes an identity of a user that left the comment (an image of the user or an image that the user selected to represent her, the user's name "User 1"), the user's title, and a location where the user is based or currently located (although more or less information may be provided in association with comments).

In some examples, selectable options for communicating with a user that left a comment may be presented to a user. In the illustrated example, context and messaging information 414 includes a selectable element for sending the commenting user an email, which if selected may automatically populate a "to" field in an email with the commenting user's email address. Context and messaging information 414 also includes a selectable element for initiating a real-time messaging interface with the commenting user. In additional examples, selectable elements may be provided for initiating voice and/or video communications with a commenting user. In still other examples, selectable elements may be provided for sending a reply comment and/or message back to the commenting user. In additional examples, selectable options may be provided for indicating that an issue that was flagged by the commenting user has been resolved by the comment receiver.

Figure 5:
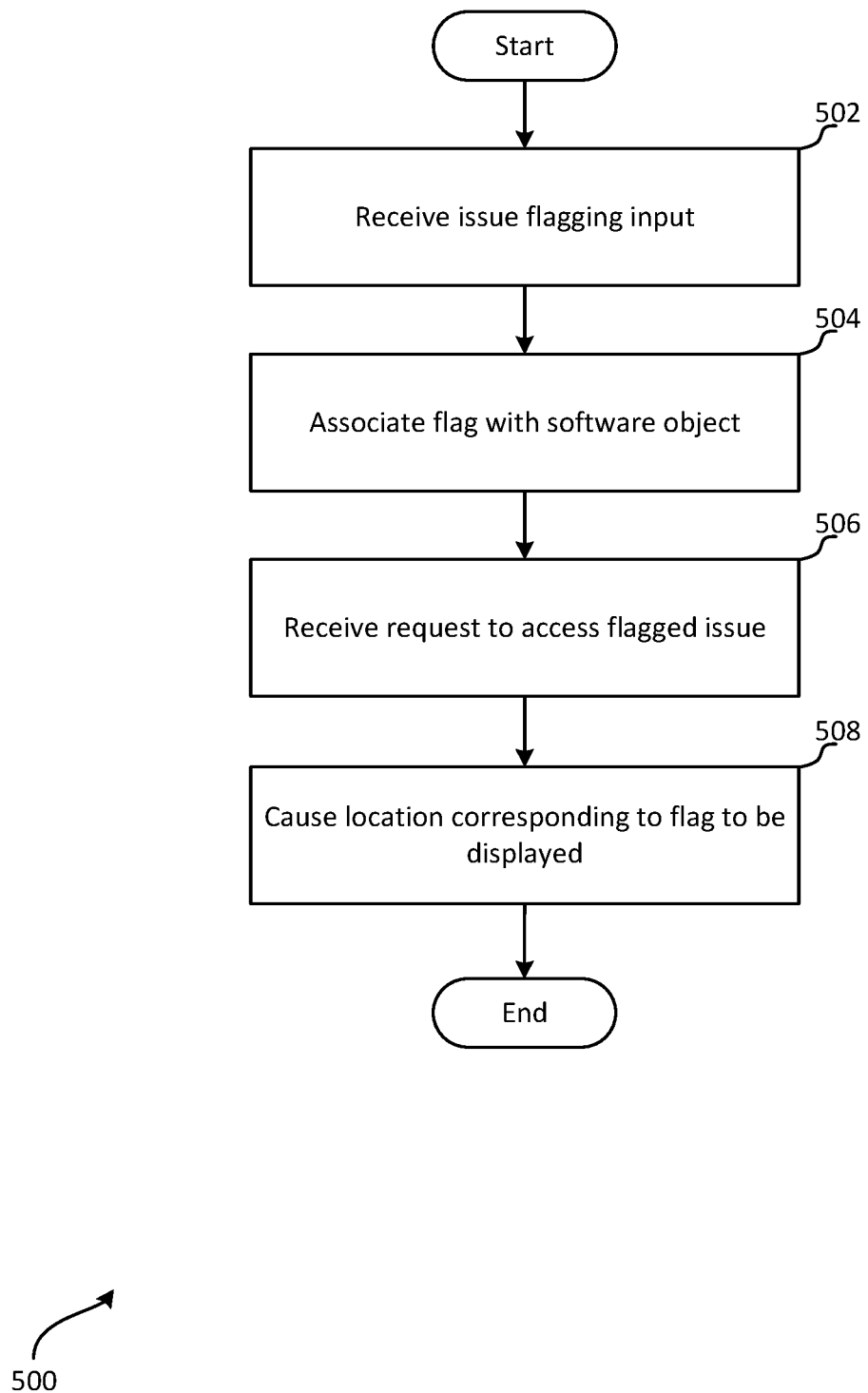
FIG. 5 illustrates an exemplary method for facilitating user communication for industrial automation system design.

FIG. 5 illustrates an exemplary method 500 for facilitating user communication for industrial automation system design. The method 500 begins at a start operation and flow continues to operation 502.

At operation 502 a first user's input for flagging an issue for review by a second user is received in relation to a software automation object integrated in an industrial automation routine. For example, a user working on an automation routine and/or controller logic associated with that routine in an industrial automation application may indicate that a flag should be associated with a software automation object in the routine and/or controller logic. According to some examples, the flag may indicate that there is a generic issue with the associated software automation object and/or routine. In other examples, a user may leave a comment with the flag and/or the flag itself may comprise a comment. In some examples, the flag may comprise a question and/or instructions associated with the software automation object and/or routine.

From operation 502 flow continues to operation 504 where a flag is associated with the software automation object corresponding to the first user's input. For example, the flag and/or comment may be associated with a software automation object and/or routine that the object is in, such that when another user opens up another routine that includes the software automation object, and/or controller logic that includes the software automation object, that user may be presented with an indication that the software automation object has been flagged. The indication may comprise a display element such as a flag element associated with the software automation object in the routine and/or controller logic in the routine. In other examples, where the flag comprises a comment, the comment may appear in a pop-up window and/or a separate messaging interface. In some examples, when a user's credentials are associated with a routine that includes a software automation object that has been flagged by another user, an electronic messaging account associated with the credentials may receive a notification that a flag has been applied in a routine that that user is working in. In some instances, the message may include a link that navigates the user directly to the software automation object and/or routine where the flag/comment was left.

From operation 504 flow continues to operation 506 where a request to access the flagged issue is received from the second user. In examples where the second user received an electronic message with a link, the second user may click on that link to navigate to a routine and/or controller logic that includes the flagged issue. In some examples, a user may click on, provide a touch input, use a voice command, etc., to provide the request to access the flagged issue.

From operation 506 flow continues to operation 508 where a location in the industrial automation routine corresponding to the flagged issue and the software automation object is caused to be displayed on a computing device associated with the second user. For example, a routine that includes a flagged issue and/or flagged software automation object, may be caused to be opened and surfaced at the location corresponding to the flagged issue. In additional examples, controller logic that includes a flagged issue and/or flagged software automation object, may be caused to be opened and surfaced at the location corresponding to the flag. In additional examples, a specific part of a software automation object that has been flagged may be surfaced for a user that has requested access to the flagged issue.

From operation 508 flow continues to an end operation and the method 500 ends.

Figure 6:
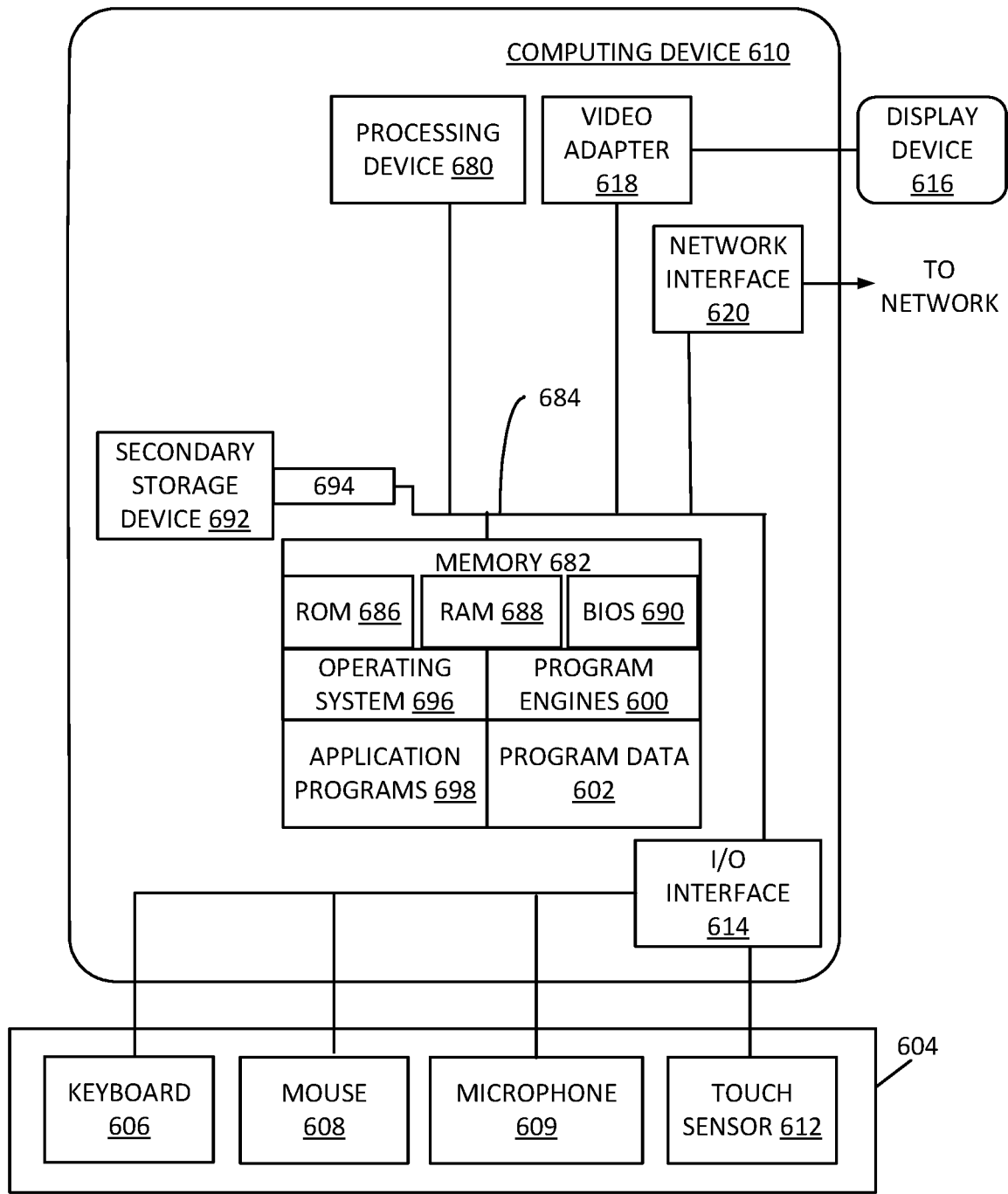
FIG. 6 is a block diagram illustrating example physical components (e.g., hardware) of a computing device with which aspects of the disclosure may be practiced.

FIG. 6 illustrates one aspect in which an exemplary architecture of a computing device according to the disclosure that can be used to implement aspects of the present disclosure, including any of the plurality of computing devices described herein with reference to the various figures and their corresponding descriptions. The computing device illustrated in FIG. 6 can be used to execute the operating system, application programs, and software modules (including the software engines) described herein, for example, with respect to FIG. 7 and program engines 714, joint rendering engine 716, module splitting engine 718, test engine 720, collaboration engine 722, and location determination engine 724. By way of example, the computing device will be described below as the industrial automation computing device 610. To avoid undue repetition, this description of the computing device will not be separately repeated for each of the other computing devices described herein, but such devices can also be configured as illustrated and described with reference to FIG. 6.

The computing device 610 includes, in some embodiments, at least one processing device 680, such as a central processing unit (CPU). A variety of processing devices are available from a variety of manufacturers, for example, Intel, Advanced Micro Devices, and/or ARM microprocessors. In this example, the computing device 610 also includes a system memory 682, and a system bus 684 that couples various system components including the system memory 682 to the processing device 680. The system bus 684 is one of any number of types of bus structures including a memory bus, or memory controller; a peripheral bus; and a local bus using any of a variety of bus architectures.

Examples of computing devices suitable for the computing device 610 include a server computer, a programmable logic controller computer, a desktop computer, a laptop computer, a tablet computer, a mobile computing device (such as a smart phone, an iPod® or iPad® mobile digital device, or other mobile devices), or other devices configured to process digital instructions.

The system memory 682 includes read only memory 686 and random access memory 688. A basic input/output system 690 containing the basic routines that act to transfer information within computing device 610, such as during start up, is typically stored in the read only memory 686.

The computing device 610 also includes a secondary storage device 692 in some embodiments, such as a hard disk drive, for storing digital data. The secondary storage device 692 is connected to the system bus 684 by a secondary storage interface 694. The secondary storage devices 692 and their associated computer readable media provide nonvolatile storage of computer readable instructions (including application programs and program engines), data structures, and other data for the computing device 610. Details regarding the secondary storage devices 692 and their associated computer readable media, as well as their associated non-volatile storage of computer readable instructions (including application programs and program engines) will be more fully described below with reference to FIG. 7.

Although the exemplary environment described herein employs a hard disk drive as a secondary storage device, other types of computer readable storage media are used in other aspects according to the disclosure. Examples of these other types of computer readable storage media include magnetic cassettes, flash memory cards, digital video disks, Bernoulli cartridges, compact disc read only memories, digital versatile disk read only memories, random access memories, or read only memories. Additional aspects may include non-transitory media. Additionally, such computer readable storage media can include local storage or cloud-based storage.

A number of program engines can be stored in secondary storage device 692 or memory 682, including an operating system 696, one or more application programs 698, other program engines 600 (such as the software engines described herein), and program data 602. The computing device 610 can utilize any suitable operating system, such as Linux, Microsoft Windows™, Google Chrome™, Apple OS, and any other operating system suitable for a computing device.

According to examples, a user provides inputs to the computing device 610 through one or more input devices 604. Examples of input devices 604 include a keyboard 606, mouse 608, microphone 609, and touch sensor 612 (such as a touchpad or touch sensitive display). Additional examples may include other input devices 604. The input devices are often connected to the processing device 680 through an input/output interface 614 that is coupled to the system bus 684. These input devices 604 can be connected by any number of input/output interfaces, such as a parallel port, serial port, game port, or a universal serial bus. Wireless communication between input devices and the interface 614 is possible as well, and includes infrared, BLUETOOTH® wireless technology, cellular and other radio frequency communication systems in some possible aspects.

In an exemplary aspect, a display device 616, such as a monitor, liquid crystal display device, projector, or touch sensitive display device, is also connected to the system bus 684 via an interface, such as a video adapter 618. In addition to the display device 616, the computing device 610 can include various other peripheral devices (not shown), such as speakers or a printer.

When used in a local area networking environment or a wide area networking environment (such as the Internet), the computing device 610 is typically connected to a network through a network interface 620, such as an Ethernet interface. Other possible embodiments use other communication devices. For example, certain aspects of the computing device 610 may include a modem for communicating across the network.

The computing device 610 typically includes at least some form of computer readable media. Computer readable media includes any available media that can be accessed by the computing device 610. By way of example, computer readable media include computer readable storage media and computer readable communication media.

Computer readable storage media includes volatile and nonvolatile, removable and non-removable media implemented in any device configured to store information such as computer readable instructions, data structures, program engines or other data. Computer readable storage media includes, but is not limited to, random access memory, read only memory, electrically erasable programmable read only memory, flash memory or other memory technology, compact disc read only memory, digital versatile disks or other optical storage, magnetic cassettes, magnetic tape, magnetic disk storage or other magnetic storage devices, or any other medium that can be used to store the desired information and that can be accessed by the computing device 610. Computer readable storage media does not include computer readable communication media.

Computer readable communication media typically embodies computer readable instructions, data structures, program engines or other data in a modulated data signal such as a carrier wave or other transport mechanism and includes any information delivery media. The term "modulated data signal" refers to a signal that has one or more of its characteristics set or changed in such a manner as to encode information in the signal. By way of example, computer readable communication media includes wired media such as a wired network or direct-wired connection, and wireless media such as acoustic, radio frequency, infrared, and other wireless media. Combinations of any of the above are also included within the scope of computer readable media.

The computing device illustrated in FIG. 6 is also an example of programmable electronics, which may include one or more such computing devices, and when multiple computing devices are included, such computing devices can be coupled together with a suitable data communication network so as to collectively perform the various functions, methods, or operations disclosed herein.

Figure 7:
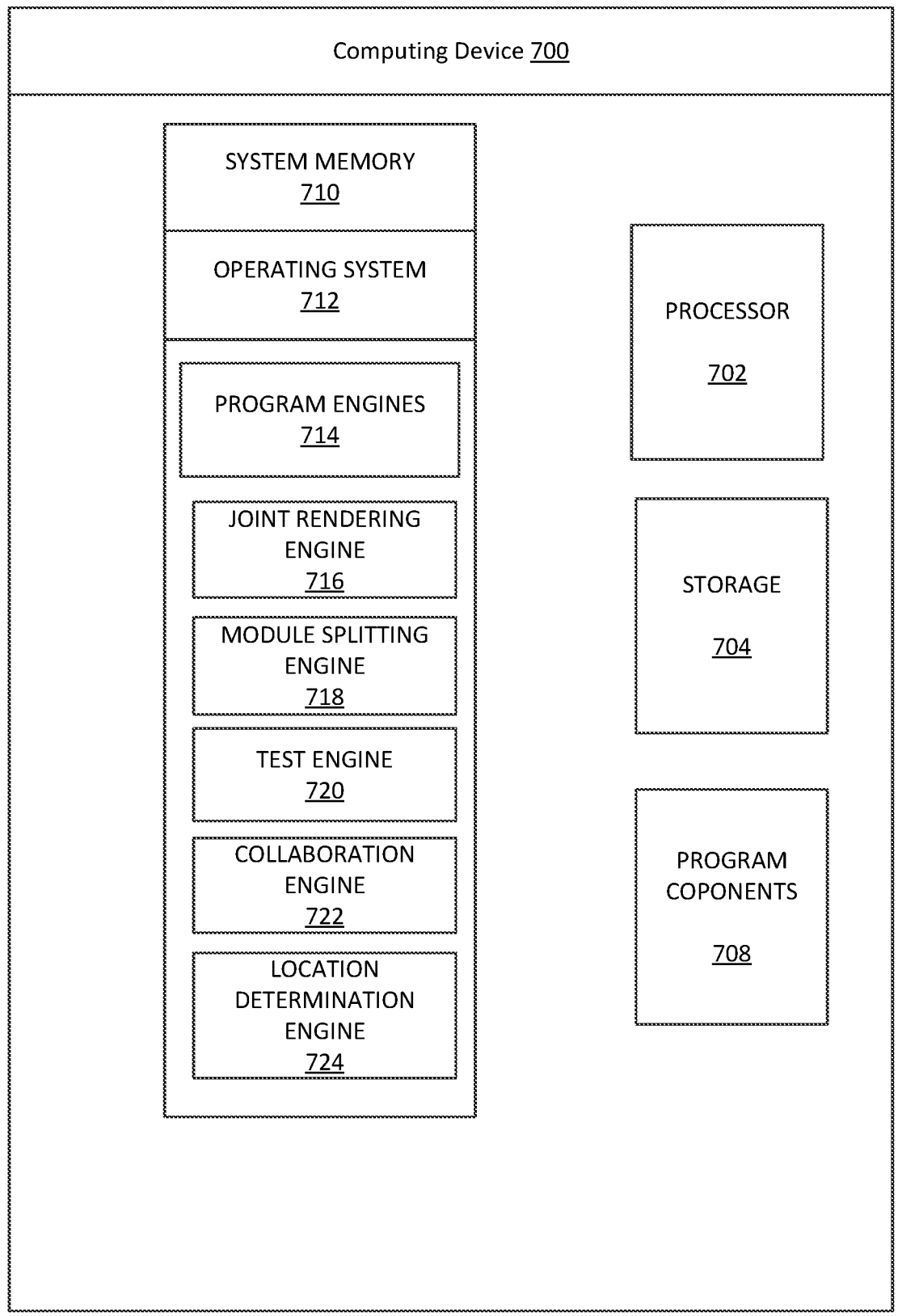
FIG. 7 is a block diagram illustrating physical components (e.g., hardware) of a computing device with which aspects of the disclosure may be practiced.

FIG. 7 is a block diagram illustrating additional physical components (e.g., hardware) of a computing device 700 with which certain aspects of the disclosure may be practiced. The computing device components described below may have computer executable instructions for: receiving, in relation to a software object integrate in an industrial automation routine, a first user's input for flagging an issue for review by a second user; associating a flag with the software object; receiving, from the second user, a request to access the flagged issue; and causing a location in the industrial automation routine corresponding to the flagged issue and the software object to be displayed on a computing device associated with the second user. Computing device 700 may perform these functions alone or in combination with a distributed computing network and/or one or more additional computing devices which may communicate and process the one or more of the program engines in FIG. 7 including joint rendering engine 716, which may perform one or more operations associated with rendering a plurality of software modules corresponding to hardware components of an automated routine/process as a singular navigable unit; module splitting engine 718, which may perform one or more operations associated with splitting at least one software module off from a collaboratively rendered software module unit; test engine 720, which may perform one or more operations associated with testing ladder logic via one or more virtual industrial controllers; collaboration engine 722, which may perform one or more operations associated with allowing users to communicate and leave notes for one another in the development of industrial automation projects; and location determination engine 724, which may perform one or more operations associated with identifying a location in a software module that has been affected by a modification to a first software module.

In a basic configuration, the computing device 700 may include at least one processor 702 and a system memory 710. Depending on the configuration and type of computing device, the system memory 710 may comprise, but is not limited to, volatile storage (e.g., random access memory), non-volatile storage (e.g., read-only memory), flash memory, or any combination of such memories. The system memory 710 may include an operating system 712 and one or more program engines 714 suitable for facilitating object-based cross-domain industrial automation control, such as one or more components in regards to FIG. 6 and, in particular, joint rendering engine 716, module splitting engine 718, test engine 720, collaboration engine 722, and location determination engine 724. The operating system 712, for example, may be suitable for controlling the operation of the computing device 700. Furthermore, aspects of the disclosure may be practiced in conjunction with a graphics library, other operating systems, or any other application program and is not limited to any particular application or system.

The computing device 700 may have additional features or functionality. For example, the computing device 700 may also include additional data storage device (removable and/or non-removable) such as, for example, magnetic disks, optical disks, or tape. Such additional storage is illustrated in FIG. 7 by storage 704. It will be well understood by those of skill in the art that storage may also occur via distributed computing networks, which are not shown in FIG. 7.

As stated above, a number of program engines and data files may be stored in the system memory 710. While executing the processor 702, the program engines 714 (e.g., joint rendering engine 716, module splitting engine 718, test engine 720, collaboration engine 722, and location determination engine 724) may perform processes including, but not limited to, the aspects described herein.

Aspects of the present disclosure, for example, are described above with reference to block diagrams and/or operational illustrations of methods, systems, and computer program products according to aspects of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present disclosure, one skilled in the art may envision variations, modifications, and alternate aspects falling within the spirit of the broader aspects of the general inventive concept embodied in this application that do not depart from the broader scope of the claimed disclosure.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

The invention claimed is:

1. A non-transitory computer-readable medium having stored thereon instructions to facilitate industrial automation system design that, in response to execution, cause a system comprising a processor to perform operations, the operations comprising:
    causing a first user interface to be displayed, the first user interface comprising a first industrial automation routine comprising a set of software objects that correspond to physical devices in an industrial automation system;
    receiving a user input via the first user interface flagging an issue for review relating to a software object integrated into the first industrial automation routine;
    in response to receiving the user input:
        associating a flag with the software object in an object repository;
        identifying locations within other industrial automation routines that comprise the software object; and
        associating the flag with the other industrial automation routines that comprise the software object;
    causing a second user interface to be displayed, the second user interface comprising a second industrial automation routine that comprises the software object and the flag;
    receiving a user request to access the flag via the second user interface; and
    in response to receiving the user request, causing a location in the second industrial automation routine corresponding to the issue and the software object to be displayed on the second user interface.

2. The non-transitory computer-readable medium of claim 1, wherein the location in the second industrial automation routine corresponding to the issue and the software object comprises a portion of development code for the second industrial automation routine.

3. The non-transitory computer-readable medium of claim 1, wherein the operations further comprise, in response to associating the flag with the software object, transmitting an electronic notification.

4. The non-transitory computer-readable medium of claim 3, wherein the electronic notification comprises a link to the location in the second industrial automation routine corresponding to the issue and the software object.

5. The non-transitory computer-readable medium of claim 1, wherein the flag is associated with the software object in a shared object library.

6. The non-transitory computer-readable medium of claim 5, wherein the shared object library comprises a plurality of software objects that correspond to the physical devices in the industrial automation system.

7. The non-transitory computer-readable medium of claim 6, wherein each of the plurality the software objects has at least one property that an automated control device can be programmed to act on, and wherein each of the plurality of software objects has at least one property that a human machine interface component can utilize in generating an element for display on a human machine interface.

8. A system for facilitating user communication for industrial automation system design, comprising:
- a memory that stores executable components; and
- a processor, functionally coupled to the memory, that executes the executable components, the executable components comprising program instructions stored on the memory that, when executed by the processor, direct the processor to at least:
- cause a first user interface to be displayed, the first user interface comprising a first industrial automation routine comprising a set of software objects that correspond to physical devices in an industrial automation system;
- receive a user input flagging an issue for review relating to a software object integrated in the first industrial automation routine;
- in response to receiving the user input;
  - associate a flag with the software object in an object repository;
  - identify locations within other industrial automation routines that comprise the software object; and
  - associate the flag with the other industrial automation routines that comprise the software object;
- cause a second user interface to be displayed, the second user interface comprising a second industrial automation routine that comprises the software object and the flag;
- receive a user request to access the flag; and
- in response to receiving the user request, cause a location in the second industrial automation routine corresponding to issue and the software object to be displayed on the second user interface.

9. The system of claim 8, wherein the user input is received in relation to ladder logic for the software object and the location in the second industrial automation routine comprises a portion of controller code.

10. The system of claim 8, wherein the user input is received in relation to ladder logic for the software object, and the location in the second industrial automation routine comprises a portion of Human Machine Interface (HMI) code.

11. The system of claim 8, wherein the user input comprises a request to leave a comment for review, and wherein to associate the flag with the software object comprises the processor further directed to associate the comment with the software object.

12. The system of claim 8, wherein the location corresponding to the issue and the software object comprises a portion of development code of the second industrial automation routine.

13. The system of claim 8, wherein the processor is further directed to, in response to associating the flag with the software object, enable transmission of an electronic notification.

14. The system of claim 13, wherein the electronic notification comprises a link to the location corresponding to the issue and the software object.

15. The system of claim 8, wherein the flag is associated with the software object in a shared object library.

16. The system of claim 15, wherein the shared object library comprises a plurality of software objects that correspond to the physical devices in the industrial automation system.

17. The system of claim 16, wherein each of the plurality of software objects has at least one property that an automated control device can be programmed to act on, and wherein each of the plurality of software objects has at least one property that a human machine interface component can utilize in generating an element for display on a human machine interface.

18. A method for facilitating user communication for industrial automation system design, comprising:
- causing a first user interface to be displayed, the first user interface comprising a first industrial automation routine comprising a set of software objects that correspond to physical devices in an industrial automation system;
- receiving a user input flagging an issue for review relating to a software object integrated into the first industrial automation routine;
- in response to receiving the user input:
  - associating a flag with the software object in an object repository;
  - identifying locations within other industrial automation routines that comprise the software object; and
  - associating the flag with the other industrial automation routines that comprise the software object;
- causing a second user interface to be displayed, the second user interface comprising a second industrial automation routine that comprises the software object and the flag;
- receiving a user request to access the flag; and
- in response to receiving the user request, causing a location in the second industrial automation routine corresponding to the issue and the software object to be displayed on the second user interface.

19. The method of claim 18, wherein the user input is received in relation to ladder logic for the software object and the location in the second industrial automation routine comprises a portion of controller code.

20. The method of claim 18, wherein the user input is received in relation to ladder logic for the software object, and the location in the second industrial automation routine comprises a portion of Human Machine Interface (HMI) code.

* * * * *